United States Patent
Okazaki et al.

(10) Patent No.: US 8,987,125 B2
(45) Date of Patent: Mar. 24, 2015

(54) METHOD FOR MANUFACTURING SEMICONDUCTOR DEVICE

(71) Applicant: Mitsubishi Electric Corporation, Chiyoda-ku (JP)

(72) Inventors: Hiroyuki Okazaki, Tokyo (JP); Takuma Nanjo, Tokyo (JP); Yosuke Suzuki, Tokyo (JP); Akifumi Imai, Tokyo (JP); Muneyoshi Suita, Tokyo (JP); Eiji Yagyu, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 13/910,607

(22) Filed: Jun. 5, 2013

(65) Prior Publication Data
US 2014/0011349 A1    Jan. 9, 2014

(30) Foreign Application Priority Data

Jul. 5, 2012  (JP) ................................. 2012-151680
Apr. 3, 2013  (JP) ................................. 2013-077408

(51) Int. Cl.
*H01L 29/66* (2006.01)
*H01L 29/778* (2006.01)
*H01L 21/285* (2006.01)
*H01L 29/423* (2006.01)
*H01L 29/20* (2006.01)

(52) U.S. Cl.
CPC .... *H01L 29/66477* (2013.01); *H01L 29/66462* (2013.01); *H01L 29/7786* (2013.01); *H01L 21/28581* (2013.01); *H01L 21/28587* (2013.01); *H01L 29/42316* (2013.01); *H01L 29/2003* (2013.01)
USPC ........................... 438/585; 438/197; 438/299

(58) Field of Classification Search
None
See application file for complete search history.

(56) References Cited

U.S. PATENT DOCUMENTS

| | | | | | |
|---|---|---|---|---|---|
| 4,532,004 | A | * | 7/1985 | Akiyama et al. | 438/183 |
| 4,711,701 | A | * | 12/1987 | McLevige | 438/183 |
| 4,859,618 | A | * | 8/1989 | Shikata et al. | 438/181 |
| 4,997,778 | A | * | 3/1991 | Sim et al. | 438/182 |
| 5,212,117 | A | * | 5/1993 | Tsuji | 438/698 |

(Continued)

FOREIGN PATENT DOCUMENTS

| | | |
|---|---|---|
| JP | 5-267350 | 10/1993 |
| JP | 9-293736 | 11/1997 |

(Continued)

OTHER PUBLICATIONS

Yunju Sun, et al., "Large-Signal Performance of Deep Submicrometer AlGaN/AlN/GaN HEMTs With a Field-Modulating Plate", IEEE Transactions on Electron Devices, vol. 52, No. 8, Aug. 2005, pp. 1689-1692.

*Primary Examiner* — Angel Roman
(74) *Attorney, Agent, or Firm* — Oblon, McClelland, Maier & Neustadt, L.L.P.

(57) ABSTRACT

The present invention relates to a method for manufacturing a heterojunction semiconductor device including an AlGaN layer, the method including the steps of (a) forming a dummy electrode in a region where a gate electrode is arranged on the AlGaN layer, (b) depositing a dielectric film on the AlGaN layer by exposing side surfaces of the dummy electrode, using a device having anisotropy, (c) forming an opening in the dielectric film by removing the dummy electrode, and (d) forming the gate electrode that extends from inside the opening onto the dielectric film in a vicinity of the opening.

16 Claims, 10 Drawing Sheets

(56) References Cited

U.S. PATENT DOCUMENTS

| | | | |
|---|---|---|---|
| 6,140,169 A * | 10/2000 | Kawai et al. | 438/197 |
| 8,283,699 B2 * | 10/2012 | Wu | 257/192 |
| 2002/0115242 A1 * | 8/2002 | Joo et al. | 438/149 |
| 2003/0134460 A1 * | 7/2003 | Forbes et al. | 438/158 |
| 2006/0269671 A1 * | 11/2006 | Kim et al. | 427/255.14 |

FOREIGN PATENT DOCUMENTS

| | | |
|---|---|---|
| JP | 2000-77351 | 3/2000 |
| JP | 2000-195874 | 7/2000 |

* cited by examiner

F I G. 2
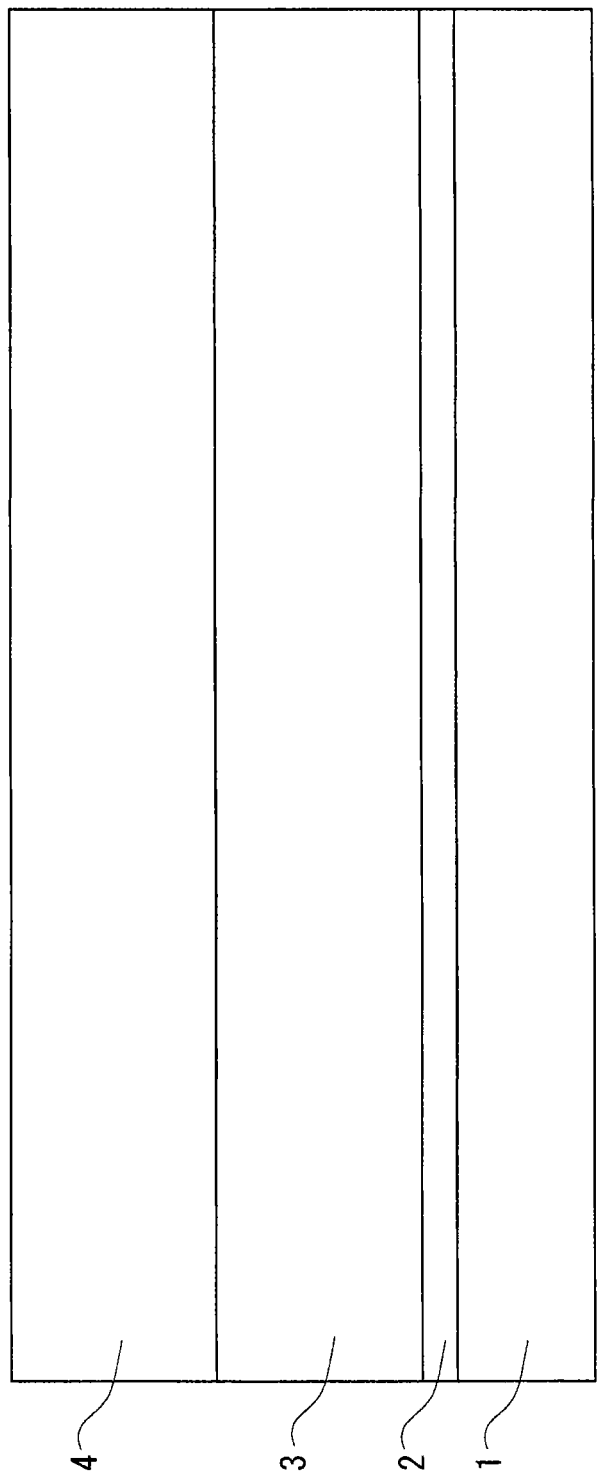

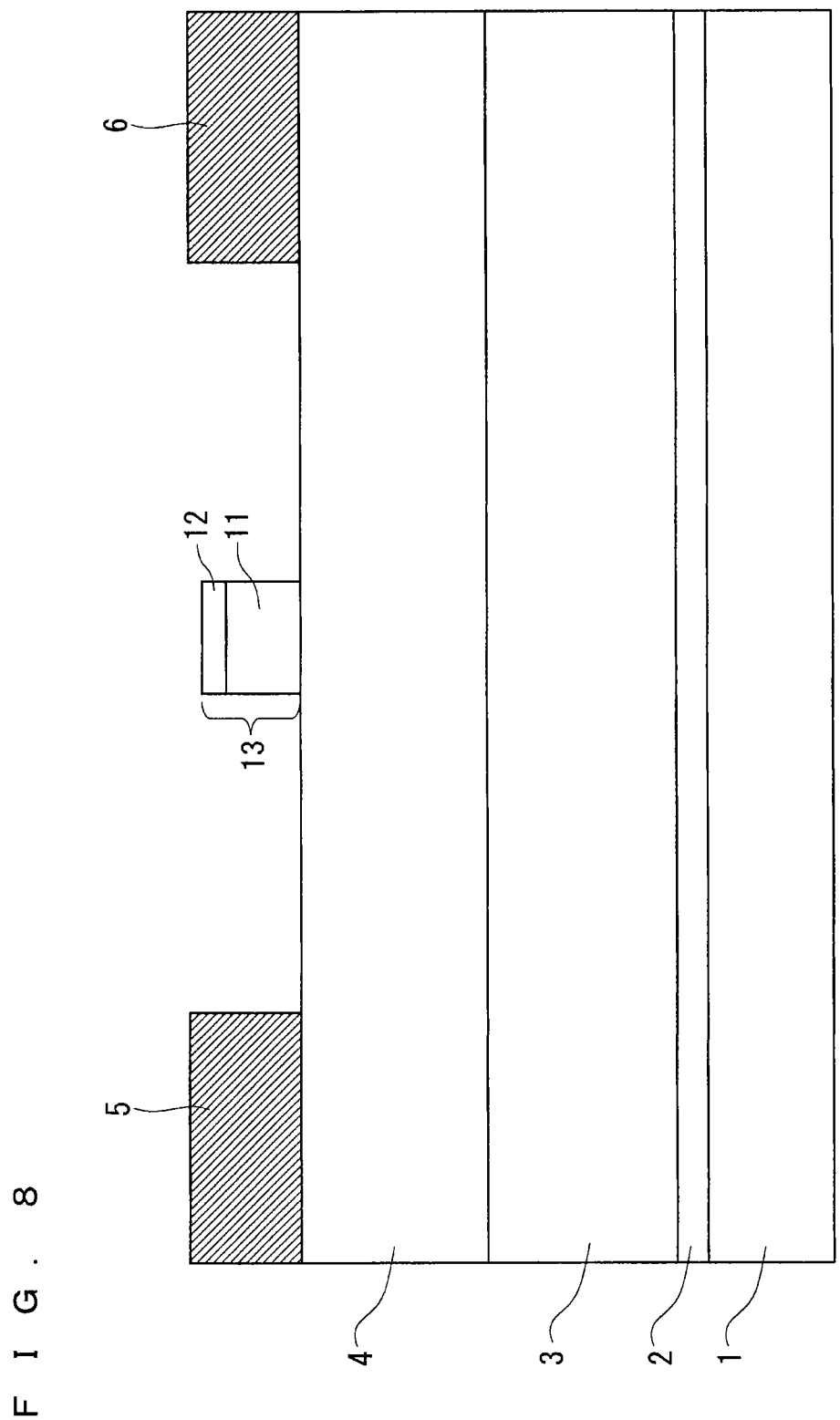

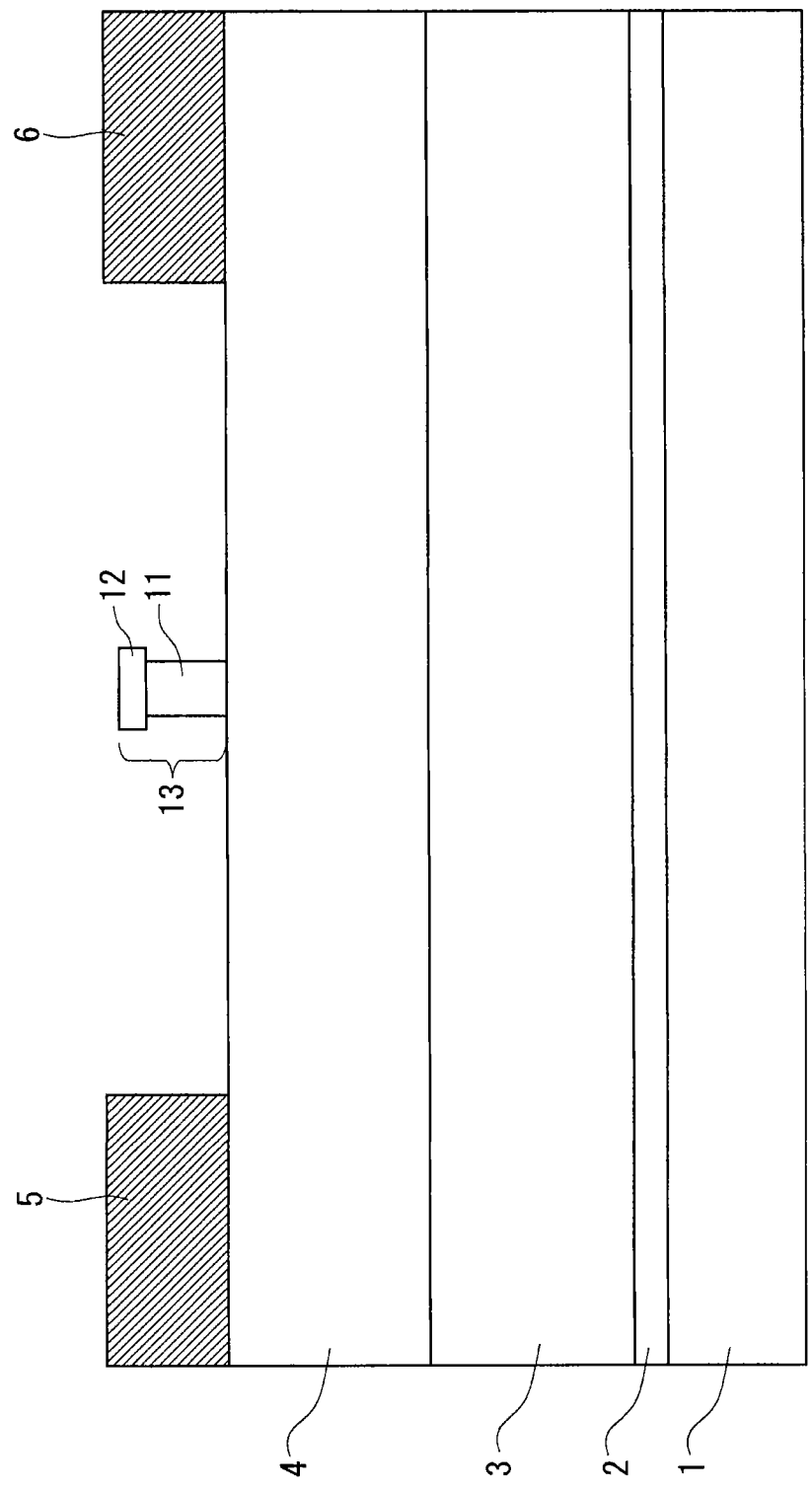

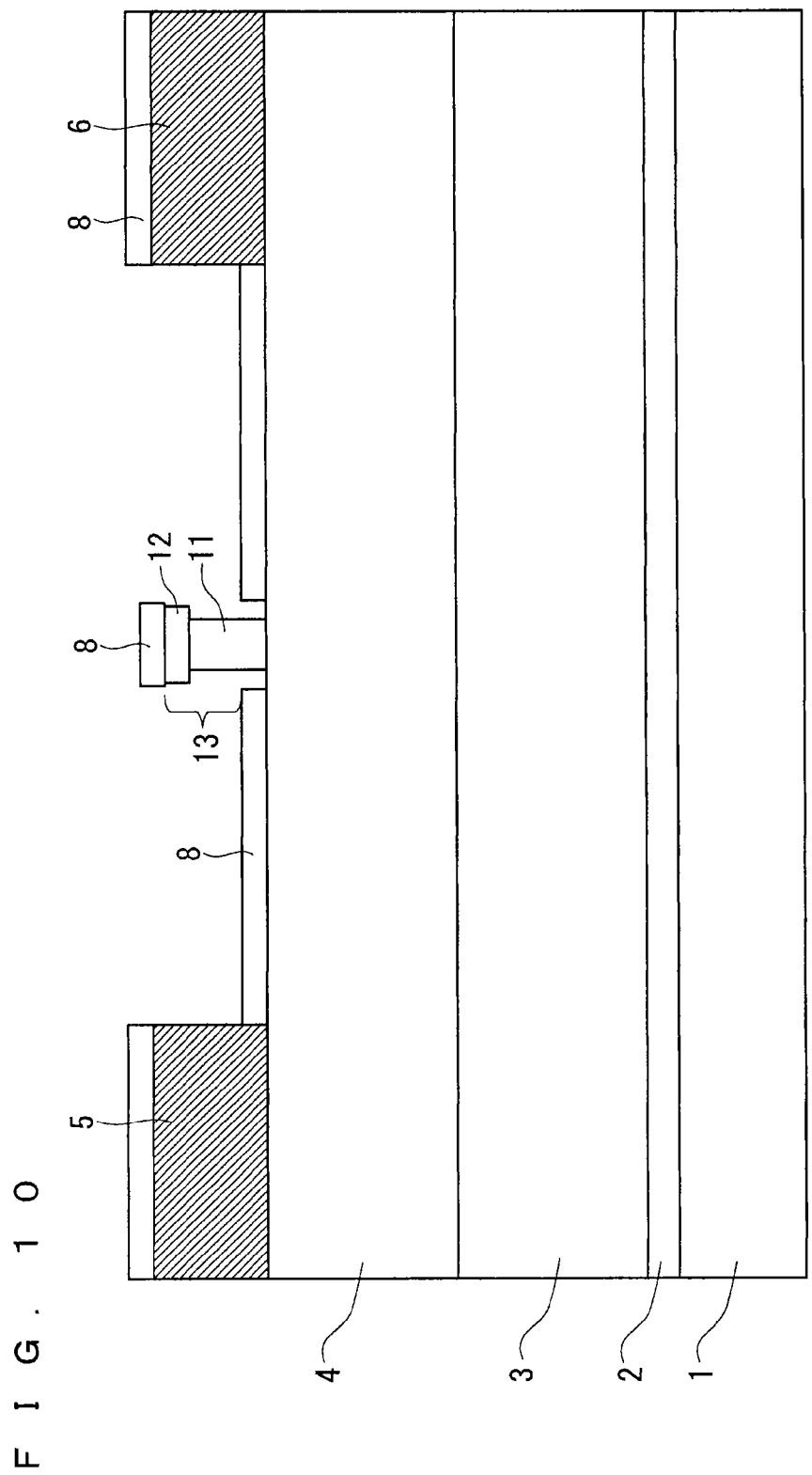

METHOD FOR MANUFACTURING SEMICONDUCTOR DEVICE

FIELD OF THE INVENTION

The present invention relates to a method for manufacturing a semiconductor device, and particularly to a method for manufacturing a gate electrode of a semiconductor device having a heterojunction including an AlGaN layer.

DESCRIPTION OF THE BACKGROUND ART

In a heterojunction field-effect transistor including nitride, as one example of a semiconductor device, when a gate length is shortened to cope with a high frequency, a sectional area of a gate electrode is reduced, and a gate resistance is increased. To above this, there is provided a method in which a metal portion is enlarged in a shape of an opened umbrella (shape of eaves, overhanging and overriding shape) above the gate electrode, the sectional area of the gate electrode is enlarged, and the gate resistance is reduced while a substantial gate length making contact with a semiconductor layer is shortened.

Further, in a heterojunction field-effect transistor made of a semiconductor including nitride, to suppress characteristic current collapse, a dielectric film is inserted between the enlarged metal portion and the semiconductor layer so that an electric filed concentrated on an end of a gate electrode on a side of a drain electrode is alleviated when a high voltage is applied to the drain electrode. A document named as a typical example for this is "Yunju Sun, Lester F. Eastman, "IEEE TRANSACTIONS ON ELECTRON DEVICES, Vol. 52", 2005, p. 1689".

To shorten the gate length as much as possible and increase the sectional area of the gate electrode in the heterojunction field-effect transistor made of the semiconductor including nitride, it is necessary to provide a structure with the shape of an opened umbrella (shape of eaves, overhanging and overriding shape), and the dielectric film is inserted between the umbrella for increasing the sectional area and the semiconductor. To achieve this, it is necessary to form the dielectric film on the semiconductor before the gate electrode is formed, thereafter, remove, by dry etching, the dielectric film in a region where the gate electrode is formed, and then deposit the gate electrode so that the gate electrode covers the region where the dielectric film is removed.

However, when such a method is used, damage is caused in the semiconductor layer during the dry etching process, and gate leak current and current collapse characteristics deteriorate.

Alternatively, when the dielectric film is formed after the gate electrode is formed, it is difficult to insert the dielectric film in a region between the umbrella and the semiconductor.

When a dielectric film is formed after the gate electrode having a rectangular shape is formed, and further an electrode is formed again so as to cover the gate electrode after the dielectric film immediately above the gate electrode is removed, damaging the semiconductor during the dry etching process can be avoided. However, in this case, it is necessary to perform a lithography process on the gate electrode in resolution higher than that for the gate electrode, and this makes the gate electrode longer for that amount, which causes a problem of not providing a high-frequency characteristic.

SUMMARY OF THE INVENTION

It is an object of the present invention to provide a method for manufacturing a semiconductor device, which can easily form a gate electrode for achieving a reduction of a gate resistance and a high-frequency characteristic in a semiconductor device having a heterojunction.

A method for manufacturing a semiconductor device according to an aspect of the present invention is a method for manufacturing a heterojunction semiconductor device including an AlGaN layer, the method including the steps of (a) forming a dummy electrode in a region where a gate electrode is arranged on the AlGaN layer, (b) depositing a dielectric film on the AlGaN layer by exposing side surfaces of the dummy electrode, using a device having anisotropy, (c) forming an opening in the dielectric film by removing the dummy electrode, and (d) forming the gate electrode that extends from inside the opening onto the dielectric film in a vicinity of the opening.

According to the foregoing aspect of the present invention, in the heterojunction semiconductor device, a gate electrode for achieving a high-frequency characteristic can be easily formed while a gate resistance is reduced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a diagram illustrating a manufacturing process of the semiconductor device according to the preferred embodiment of the present invention;

FIG. 8 is a diagram illustrating a manufacturing process of the semiconductor device according to the preferred embodiment of the present invention;

FIG. 9 is a diagram illustrating a manufacturing process of the semiconductor device according to the preferred embodiment of the present invention; and FIG. 10 is a diagram illustrating a manufacturing process of the semiconductor device according to the preferred embodiment of the present invention.

DESCRIPTION OF THE PREFERRED EMBODIMENTS

Hereinafter, a preferred embodiment of the present invention will be described with reference to the accompanying drawings.

Preferred Embodiment

Structure

Figure 1:
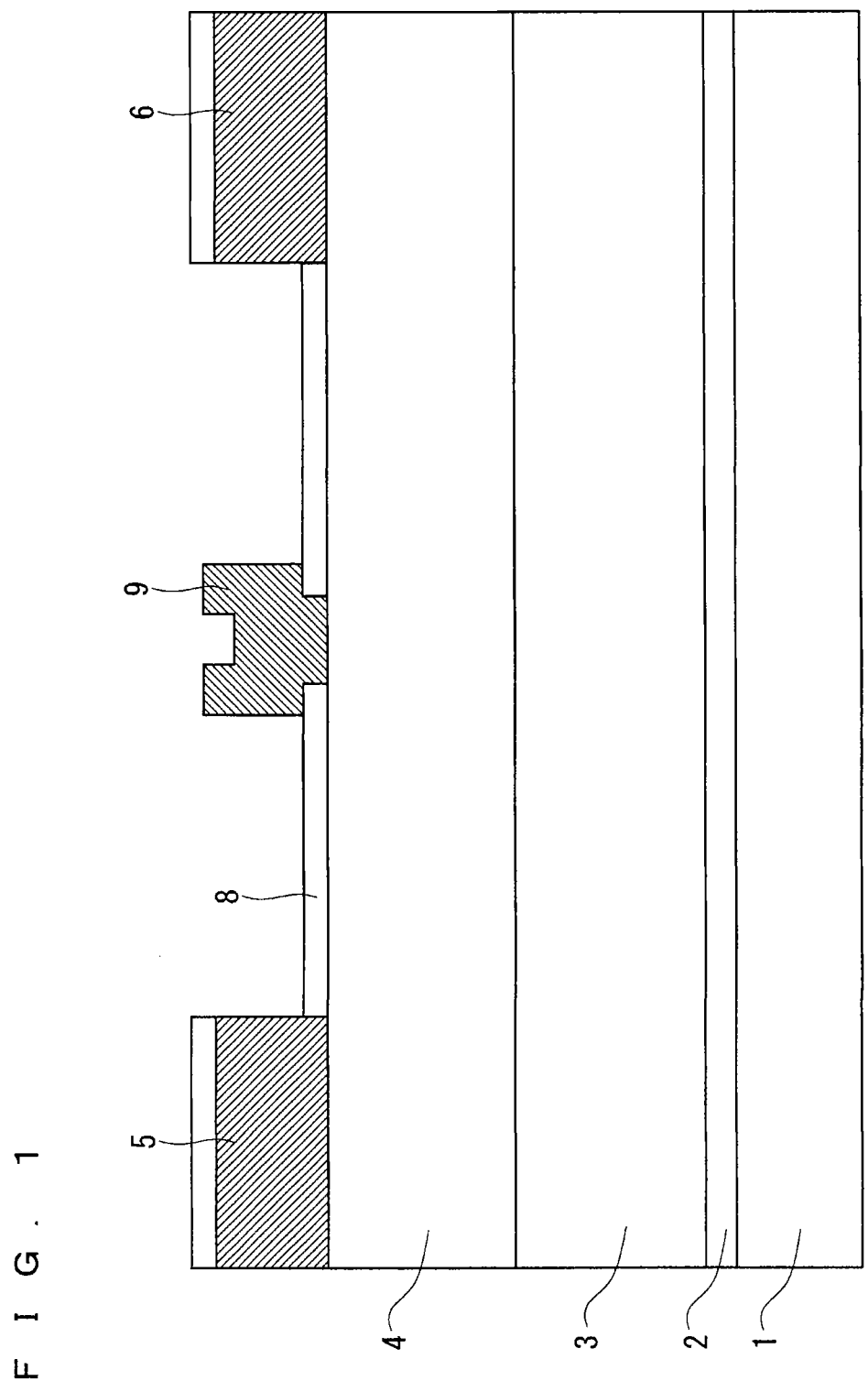
FIG. 1 is a diagram illustrating a structure of a semiconductor device according to a preferred embodiment of the present invention.

FIG. 1 is a diagram illustrating a structure of a semiconductor device having a heterojunction according to a preferred embodiment of the present invention. In this preferred embodiment, particularly, a heterojunction field-effect transistor made of a nitride semiconductor is shown.

As illustrated in FIG. 1, the heterojunction field-effect transistor includes a substrate 1 formed at a lowermost layer and made of a nitride semiconductor; a buffer layer 2 formed on the substrate 1; a channel layer 3 formed on the buffer layer 2 and made of a nitride semiconductor; a barrier layer 4 formed on the channel layer 3, forming a heterojunction with the channel layer 3, and made of a nitride semiconductor; a source electrode 5 partially formed on the barrier layer 4; a drain electrode 6 partially formed on the barrier layer 4; a dielectric film (surface protective film) 8 covering the source electrode 5, the drain electrode 6, and the barrier layer 4, and made of $SiN_x$; and a gate electrode 9 formed on a portion of the barrier layer 4 where the dielectric film 8 is not formed.

With this structure, the gate electrode 9 can be formed with an upper portion thereof in a shape of an opened umbrella (shape of eaves, overhanging and overriding shape) for increasing a sectional area while a substantial gate length making contact with the semiconductor layer (barrier layer 4) is shortened.

Further, it is possible to provide a structure in which the dielectric film 8 is inserted between the enlarged upper metal portion of the gate electrode 9 and the semiconductor layer (barrier layer 4), so that a gate leak current and current collapse can be suppressed.

It is not necessarily the case that the nitride semiconductor structure should be structured of the three layers, namely, the buffer layer 2, the channel layer 3, and the barrier layer 4, but even a single layer of the nitride semiconductor, a layer of AlGaN in particular, may be formed as long as it functions as a transistor.

Further, the dielectric layer 8 is not necessarily made of $SiN_x$, but a material of the dielectric film that can alleviate the electric field applied to an end of the gate electrode 9 on a side of the drain can be used. Such a material may include, for example, $SiO_x$, $SiO_xN_y$, $Al_xN_y$, $AlO_xN_y$, $SiN_y$, or $HfO_xN_y$.

Although the foregoing describes elements that are essentially required for the transistor to function, this is used, in the end, as a device in a structure in which wiring, via-holes, and the like are formed.

<Manufacturing Method>

FIGS. 2 to 10 illustrate one example of a manufacturing process of the heterojunction field-effect transistor made of the nitride semiconductor according to the present invention. Here, FIGS. 2 to 10 are diagrams illustrating a manufacturing process of the semiconductor device according to the preferred embodiment of the present invention.

First, as illustrated in FIG. 2, the buffer layer 2, the channel layer 3, and the barrier layer 4 are epitaxially grown in this sequence from a bottom on the substrate 1 by applying an epitaxial growth method such as an MOCVD (Metal Organic Chemical Vapor Deposition) method or an MBE (Molecular Beam Epitaxy) method.

Figure 3:
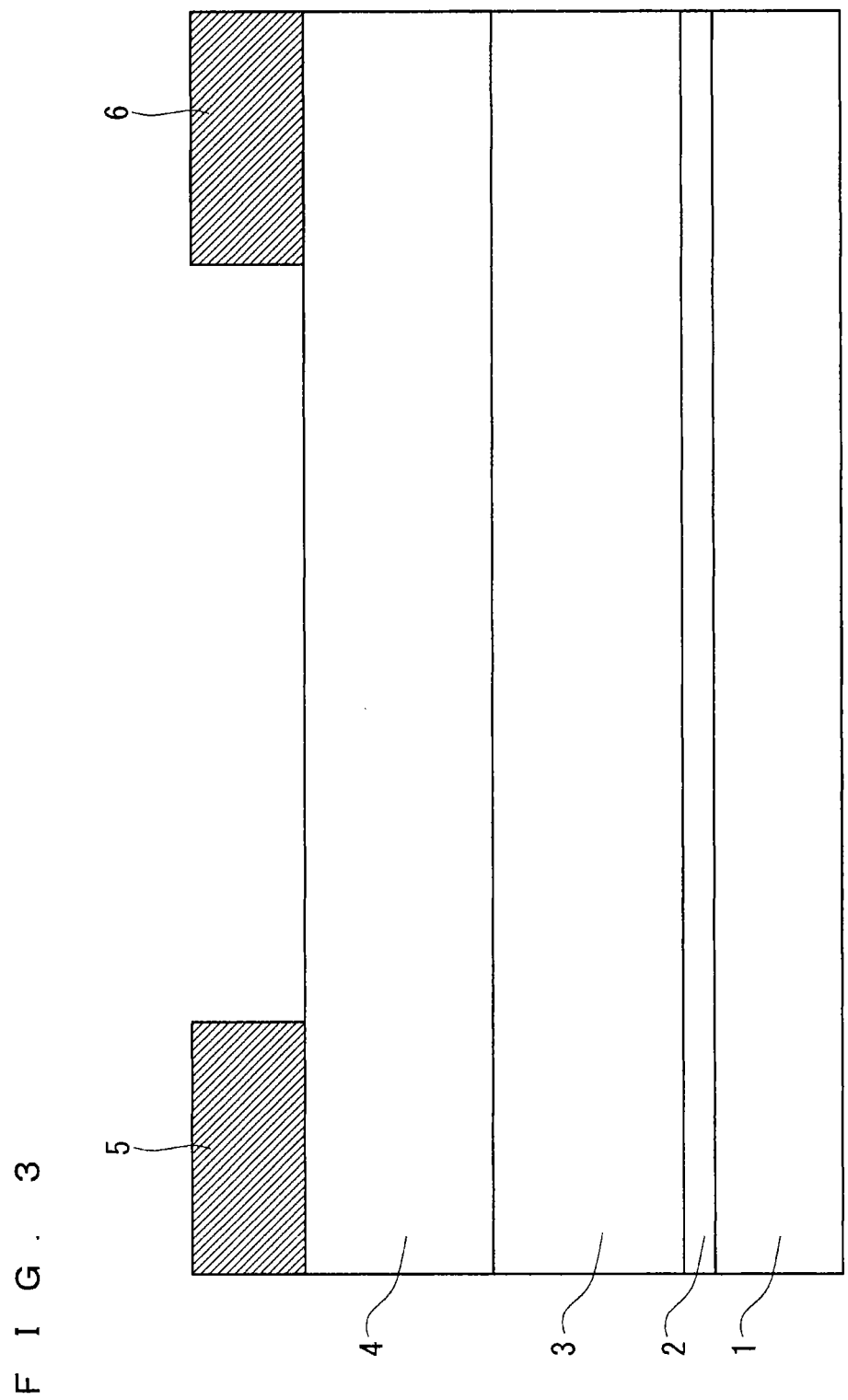
FIG. 3 is a diagram illustrating a manufacturing process of the semiconductor device according to the preferred embodiment of the present invention.

Next, as illustrated in FIG. 3, a metal such as Ti, Al, Nb, Hf, Zr, Sr, Ni, Ta, Au, Mo, and W, or a multilayer film formed of these elements is deposited by a lift-off process or the like using a vapor deposition method or a sputtering method, and thereafter the resultant is alloyed using an RTA (Rapid Thermal Anneal) method or the like to thereby form the source electrode 5 and the drain electrode 6 which have an Ohmic characteristic.

Figure 4:
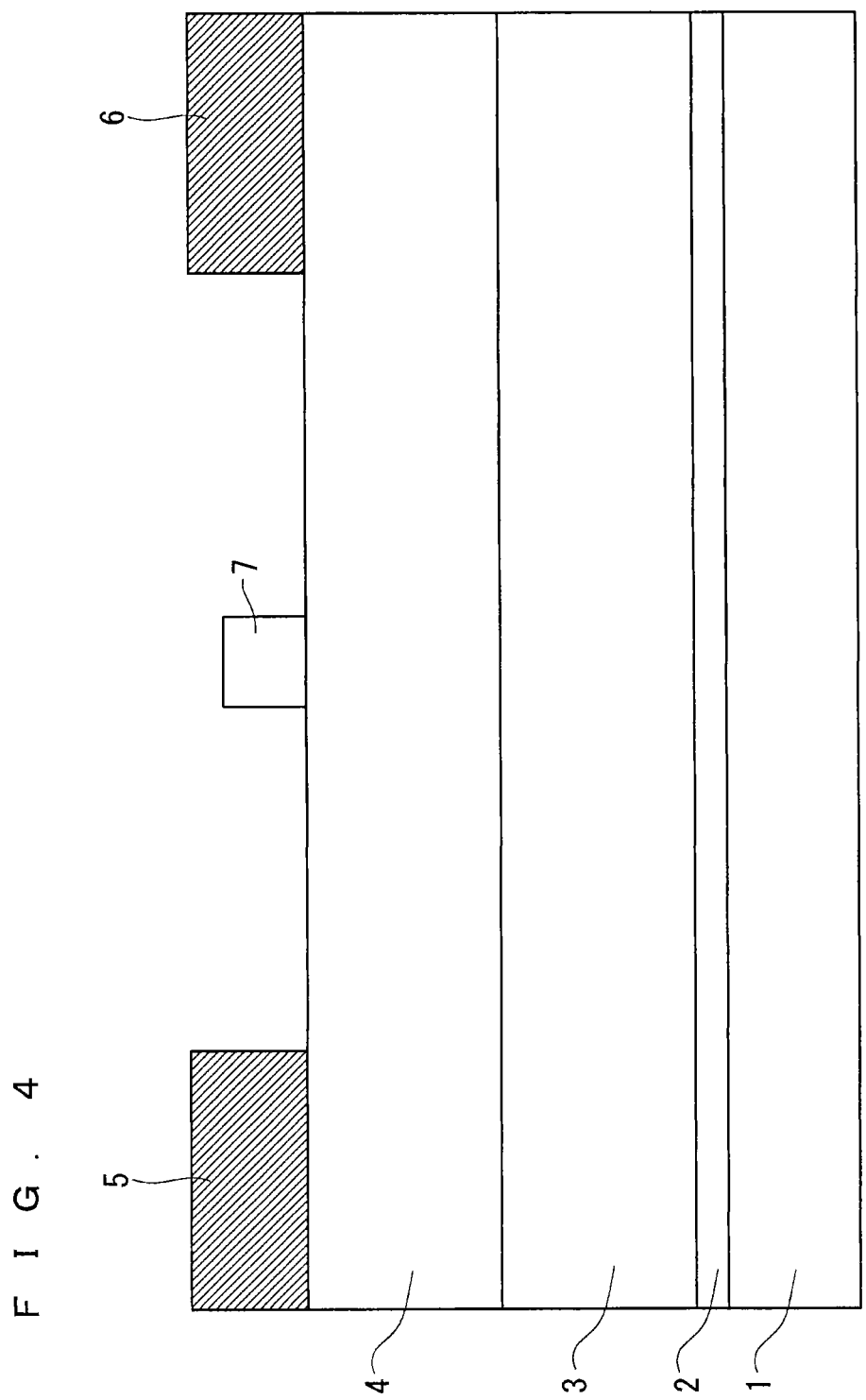
FIG. 4 is a diagram illustrating a manufacturing process of the semiconductor device according to the preferred embodiment of the present invention.

Next, as illustrated in FIG. 4, a metal such as Nb, Ta, Ti, and Zr which is soluble in HF; a metal such as Al, Cr, Fe, and Ni which is soluble in HCl; a metal such as Ag, Hg, Se, and Zn which is soluble in $HNO_3$; a metal such as Be, As, Mo, Nb, Re, and Sb which is soluble in $H_2SO_4$; or a metal such as Au, Mo, Pd, Pt, and W which is soluble in aqua regia ($HNO_3$:HCl=1:3) is deposited by a vapor deposition method or a sputtering method, and a dummy electrode 7 (dummy material corresponding to a gate portion) is formed by a lift-off process or the like. Since the dummy electrode 7 corresponds to a contact surface between the gate electrode 9 and the surface of the semiconductor layer (barrier layer 4) which will be present later, the dummy electrode 7 is formed so that the gate length thereof becomes as short as possible (so that the contact surface becomes narrow). As described above, it is preferable to use a metal that is soluble in an acid or the like as a material for the dummy electrode 7. This is because a removal rate is higher than that of the dielectric film in a removing process described later. In addition, for example, a metal whose adherence with the semiconductor is poor is named as the metal described above. This can also be easily removed in the removing process which will be described later. Although the material used for the dummy electrode 7 is a metal in this preferred embodiment, this is not limited to a metal as long as it can be removed during the removing process of the dummy material described later.

Figure 5:
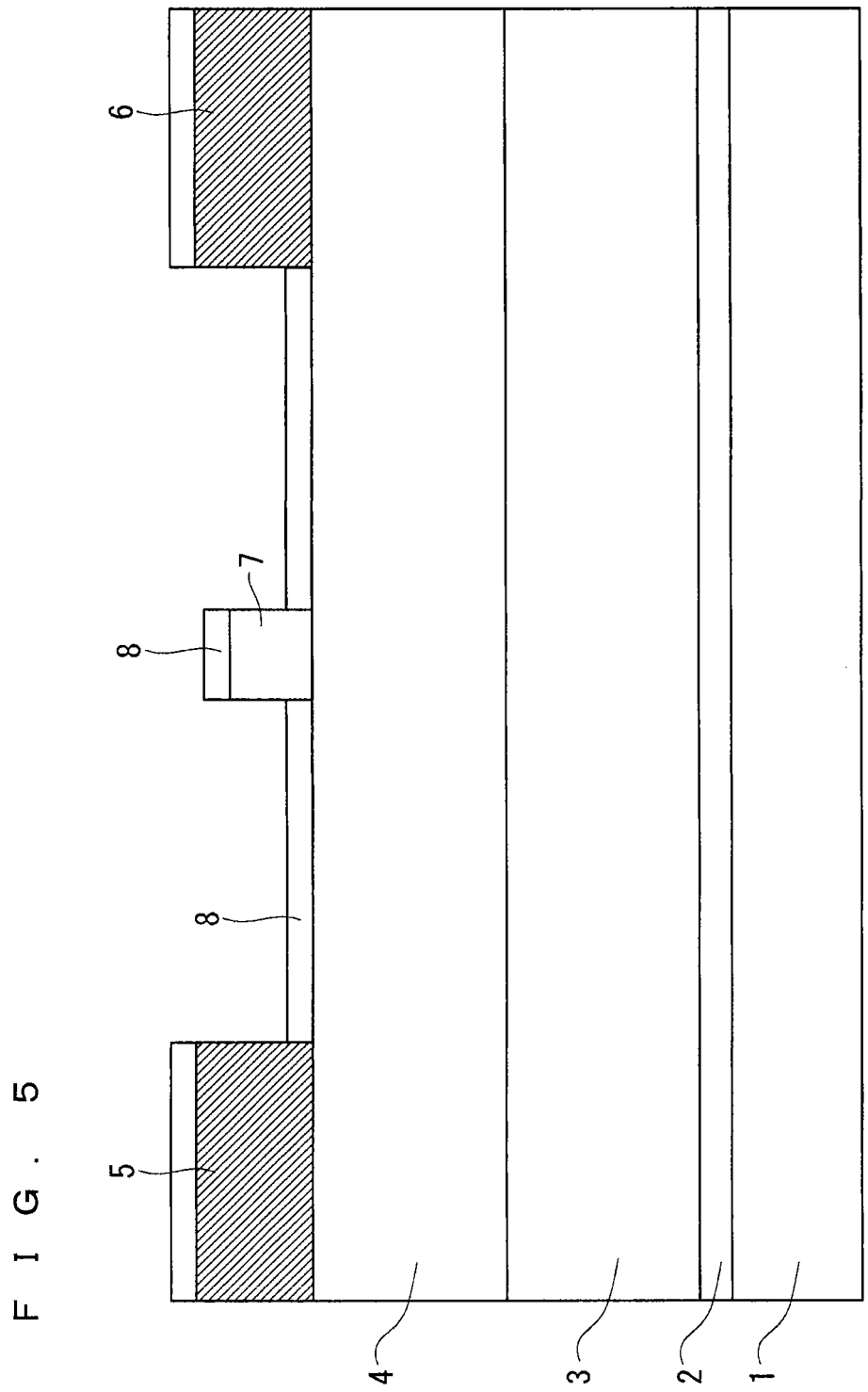
FIG. 5 is a diagram illustrating a manufacturing process of the semiconductor device according to the preferred embodiment of the present invention.

Next, as illustrated in FIG. 5, the dielectric film 8 made of, for example, $SiN_x$, $SiO_x$, $SiO_xN_y$, or the like is deposited only in a vertical direction on the surface of the semiconductor layer (barrier layer 4) using a method having anisotropy such as a Cat-CVD (Catalytic Chemical Vapor Deposition) method or an ECR (Electron Cyclotron Resonance) sputtering method which does not allow the dielectric film 8 to deposit on side surfaces of the dummy electrode 7, so that an acid solution can easily etch the dummy electrode 7 when the dummy electrode 7 is removed. However, the method for depositing the dielectric film 8 is not limited to the foregoing, but another method having anisotropy may be used for depositing. Further, during such a process, the dielectric film 8 is deposited to have a smaller thickness as compared with the dummy electrode 7 so that the side surfaces of the dummy electrode 7 are partially and reliably exposed.

Figure 6:
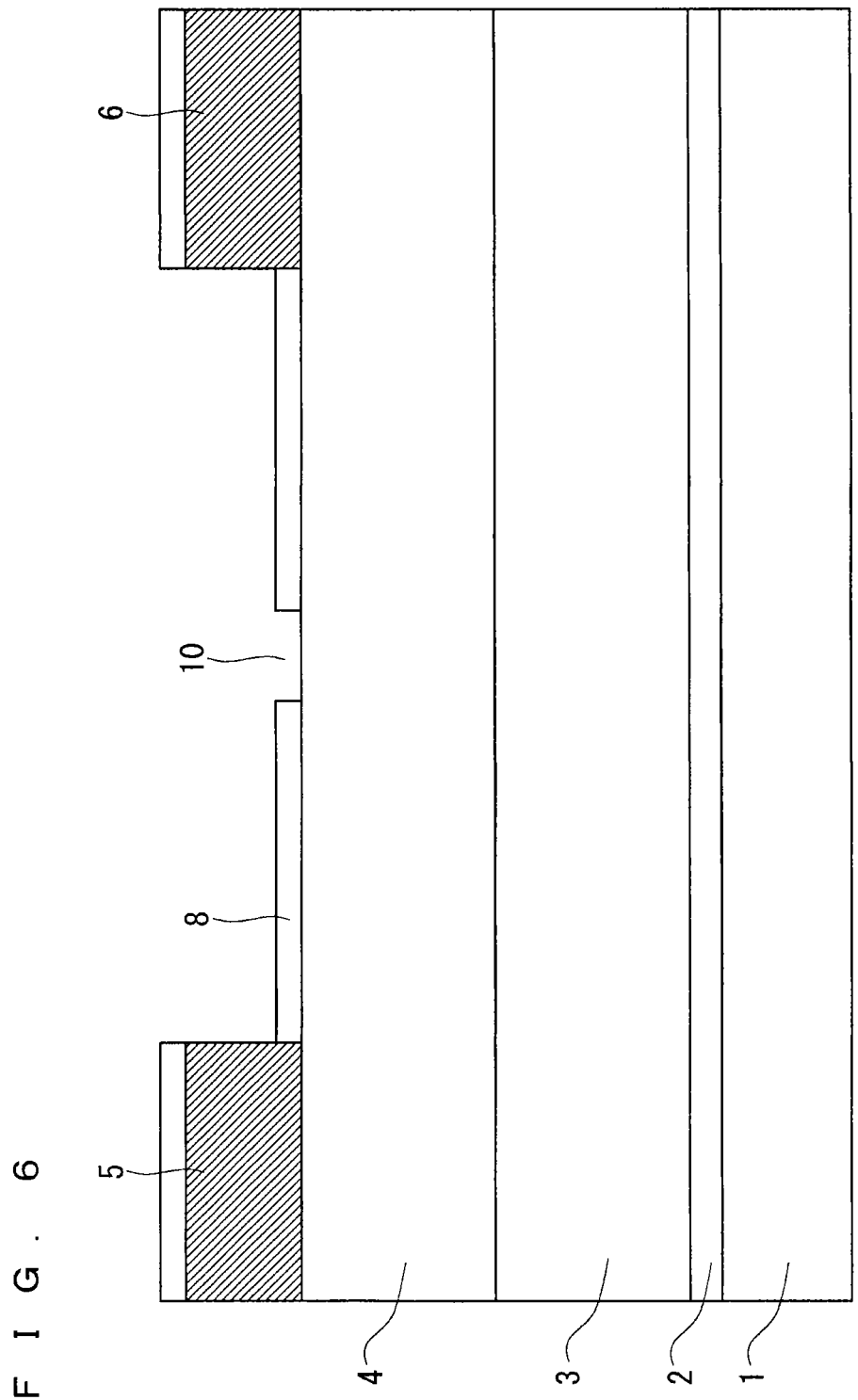
FIG. 6 is a diagram illustrating a manufacturing process of the semiconductor device according to the preferred embodiment of the present invention.

Next, as illustrated in FIG. 6, the dummy electrode 7 is removed by a wet etching process or the like using HCl, $HNO_3$, $H_2SO_4$, HF, or aqua regia ($HNO_3$:HCl=1:3) so that the surface of the semiconductor layer (barrier layer 4) and the dielectric film 8 are not damaged. In this way, an opening 10 of the dielectric film 8 is formed in an area where the dummy electrode 7 is removed.

Figure 7:
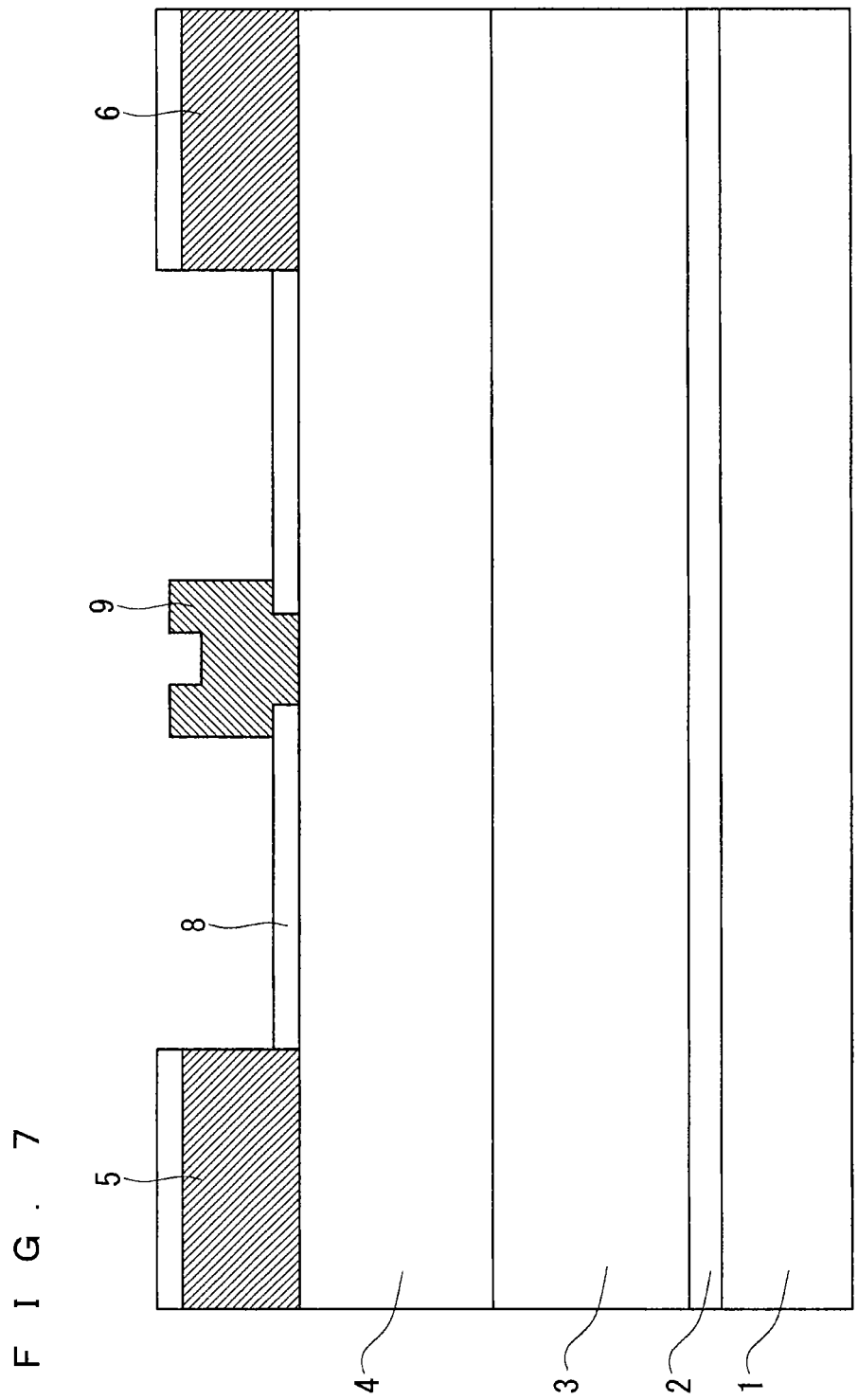
FIG. 7 is a diagram illustrating a manufacturing process of the semiconductor device according to the preferred embodiment of the present invention.

Next, as illustrated in FIG. 7, a metal such as Ti, Al, Nb, Hf, Zr, Sr, Ni, Ta, Au, Mo, W, and Pt, or a multilayer film formed of these elements is deposited by a lift-off process or the like using a vapor deposition method or a sputtering method, and the gate electrode 9 having a Schottky characteristic is formed.

During such a process, in order to increase the sectional area of the gate electrode 9, the gate electrode 9 is formed so as to have a gate length larger than the opening 10 which is opened during removal of the dummy electrode 7, i.e., so that the gate electrode 9 extends from inside the opening 10 onto the dielectric film 8 in the vicinity thereof. In this way, the gate electrode 9 having a shorter gate length and a larger gate sectional area can be formed. As a result, a gate structure having a low resistance and having a shape (shape of eaves, overhanging and overriding shape) of an opened umbrella for alleviating the electric field can be formed.

According to the above-mentioned method, a heterojunction field-effect transistor having the characteristic of suppressed gate leak current and current collapse and having the structure illustrated in FIG. 1 can be fabricated. Although the foregoing merely describes essentially required elements for the transistor to function, this is used, in the end, as a device in a structure in which wiring, via-holes, and the like are formed.

<Variation 1>

In the above preferred embodiment, the dummy electrode 7 is removed by the wet etching process. However, the dummy electrode 7 may be removed by an ultrasonic cleaning process.

In the process illustrated in FIG. 4, by depositing a metal having adherence with the semiconductor layer lower than that of the dielectric film 8, e.g., a structure in which a plurality of metal films having different stresses are deposited (e.g. layer structure of Ni/Pt/Au or the like), by a vapor deposition method or a sputtering method, in the subsequent process illustrated in FIG. 6, the dummy electrode 7 can be sufficiently removed by performing a process, which causes low damage as compared with conventional dry etching such as an ultrasonic cleaning process, on the surface of the semiconductor layer (barrier layer 4) and the dielectric film 8.

According to the foregoing method, the heterojunction field-effect transistor can be fabricated without damaging the semiconductor layer (barrier layer 4).

<Variation 2>

According to the above preferred embodiment, the dummy electrode is formed of a single layer of the metal layer. However, the side surfaces of the dummy electrode are at least partially exposed, and the dummy electrode may be formed in a T-gate shape using two or more layers of metal layers, so that the dummy electrode can be easily removed by the wet etching performed later.

As illustrated in FIG. 8, a dummy electrode 13 using two or more layers of metal layers and structured of, for example, a dummy electrode 11 and a dummy electrode 12 may be formed.

As a material for these metal layers, a metal such as Nb, Ta, Ti, and Zr which is soluble in HF; a metal such as Al, Cr, Fe, and Ni which is soluble in HCl; a metal such as Ag, Hg, Se, and Zn which is soluble in $HNO_3$; a metal such as Be, As, Mo, Nb, Re, and Sb which is soluble in $H_2SO_4$; or a metal such as Au, Mo, Pd, Pt, and W which is soluble in aqua regia ($HNO_3$: HCl=1:3) can be used. Then, such a material is deposited by a vapor deposition method or a sputtering method, and the dummy electrode 13 (dummy material corresponding to the gate portion) structured of the dummy electrode 11 and the dummy electrode 12 is formed by a lift-off process or the like.

In such a process, it is preferable that a material whose etching rate is faster by the acid be used for the dummy electrode 11 as compared with that of the dummy electrode 12.

Thereafter, as illustrated in FIG. 9, by etching the dummy electrode 13 thus formed using the acid, the dummy electrode 13 having a T-shape (a layer formed on a layer making contact with the barrier layer 4 has a wider width than the layer making contact with the barrier layer 4) is formed due to a difference of etching rates between the first layer and the second layer.

With such a shape, and by forming a structure as the dummy electrode 13 illustrated in FIG. 10, the side surfaces of the dummy electrode 13 are at least partially exposed during depositing the dielectric film 8 later, and the dummy electrode 13 can be easily removed.

The position where the dummy electrode 13 is formed is a position corresponding to a contact surface between the gate electrode 9 and the surface of the semiconductor layer (barrier layer 4) which will be present later. Therefore, it is preferable that the gate length be formed as short as possible.

In this preferred embodiment, the materials used for the dummy electrode 11 and the dummy electrode 12 are metals. However, the materials are not limited to the metal as long as the materials can be removed during the removing process of the dummy material.

<Effect>

According to the preferred embodiment of the present invention, the method for manufacturing the semiconductor device is a method for manufacturing a heterojunction semiconductor device, the method including the steps of (a) forming a dummy electrode 7 made of a dummy material in a region where a gate electrode 9 is arranged on a barrier layer 4 which is a semiconductor layer, (b) depositing a dielectric film 8 by covering the dummy electrode 7 on the barrier layer 4, (c) forming an opening 10 in the dielectric film 8 by removing the dummy electrode 7, and (d) forming the gate electrode 9 extending from inside the opening 10 onto the dielectric film 8 in the vicinity of the opening 10.

According to such a structure, the gate electrode 9 can be easily formed in the heterojunction semiconductor device while the gate resistance is reduced, and the high-frequency characteristic is achieved.

Since the gate electrode 9 has a structure in which the dielectric film 8 gets under ends of the gate electrode 9 (shape of eaves, overhanging and overriding shape), it is possible to enlarge the sectional area of the gate electrode while the substantial gate length is shortened, so that the gate resistance is reduced, and the current collapse can be suppressed.

Further, according to the preferred embodiment of the present invention, the step (c) for forming the opening 10 in the dielectric film 8 by removing the dummy electrode 7 is a step for removing the dummy electrode 7 as the dummy material by a wet etching process.

According to such a structure, the dummy material made of a material having low adherence with the semiconductor layer and being soluble in the acid is removed while it suppresses damage caused in the barrier layer 4 which is a semiconductor layer. As a result, the gate leak current and the current collapse can be suppressed.

Further, according to the preferred embodiment of the present invention, the step (c) for forming the opening 10 in the dielectric film 8 by removing the dummy electrode 7 is a step for removing the dummy electrode 7 as the dummy material by an ultrasonic cleaning process.

According to such a structure, the dummy material made of a material having low adherence with the semiconductor layer and being soluble in the acid is removed while it suppresses damage caused in the barrier layer 4 which is a semiconductor layer. As a result, the gate leak current and the current collapse can be suppressed.

Further, according to the preferred embodiment of the present invention, the step (a) for forming the dummy electrode 7 made of the dummy material in the region where the gate electrode 9 is arranged on the barrier layer 4 which is a semiconductor layer is a step for forming the dummy electrode 7 made of a material having adherence with the barrier layer 4 lower than adherence of the dielectric film 8 in the region where the gate electrode 9 is arranged on the barrier layer 4.

According to such a structure, by performing a process such as the ultrasonic cleaning process or the wet etching process which causes low damage to the semiconductor layer and the dielectric film 8, the dummy electrode 7 can be sufficiently removed. As a result, the gate leak current and the current collapse can be suppressed.

Further, according to the preferred embodiment of the present invention, the step (b) for depositing the dielectric film 8 by covering the dummy electrode 7 on the barrier layer 4 is a step for depositing the dielectric film 8 which has a removal rate smaller than a removal rate of the dummy electrode 7 in the step (c) for forming the opening 10 in the dielectric film 8 by removing the dummy electrode 7.

According to such a structure, by performing a process such as the ultrasonic cleaning process or the wet etching process which causes low damage to the semiconductor layer and the dielectric film 8, the dummy electrode 7 can be sufficiently removed. As a result, the gate leak current and the current collapse can be suppressed.

Further, according to the preferred embodiment of the present invention, the step (b) for depositing the dielectric film 8 by covering the dummy electrode 7 on the barrier layer 4 is a step for depositing the dielectric film 8 by a Cat-CVD method.

According to such a structure, by depositing the dielectric film 8 by the Cat-CVD method or the like having anisotropy, the dielectric film 8 is prevented from being deposited on the exposed side surfaces of the dummy electrode 7, which can make it easier to remove the dummy electrode 7 in a subsequent step.

Further, according to the preferred embodiment of the present invention, the step (b) for depositing the dielectric film 8 by covering the dummy electrode 7 on the barrier layer 4 is a step for depositing the dielectric film 8 by an ECR sputtering method.

According to such a structure, by depositing the dielectric film 8 by the ECR sputtering method or the like having anisotropy, the dielectric film 8 is prevented from being deposited on the exposed side surfaces of the dummy electrode 7, which can make it easier to remove the dummy electrode 7 in a subsequent step.

In the preferred embodiment of the present invention, although a quality of a material, a material, a condition for the embodiment, and the like for each of the structural components are also described. However, these are examples and should not be limited to those that are described.

Here, conditions for the experiment actually conducted will be described. The dummy electrode 7 indicated in this preferred embodiment is formed by vapor depositing Al to a thickness of 360 nm. In addition, as the surface protective film 8, SiN is deposited to a thickness of 100 nm using a Cat-CVD apparatus. Thereafter, by performing wet etching using hydrochloric acid, the dummy electrode 7 as indicated in this preferred embodiment can be removed.

It should be noted that, in the present invention, variations or omissions of any arbitrary structural components are possible without departing from the scope of the invention.

Further, according to the preferred embodiment of the present invention, the step (a) for forming a dummy electrode 7 made of a dummy material in a region where a gate electrode 9 is arranged on a barrier layer 4 which is a semiconductor layer is a step for forming a dummy electrode 13 having a T-shape.

According to such a structure, by forming the dummy electrode 13 having a T-shape utilizing a difference in solubility (etching rate) in the acid or alkaline solution between the dummy electrode 11 and the dummy electrode 12 which structure the dummy electrode 13, it is possible to expose the side surfaces of the dummy electrode 13 partially when the dielectric film 8 is deposited, which makes it easy to remove the dummy electrode 13 in a subsequent step.

Further, according to the preferred embodiment of the present invention, the step (b) for depositing the dielectric film 8 by covering the dummy electrode 13 on the barrier layer 4 is a step for depositing the dielectric film 8 so that the dielectric film 8 becomes thinner than a thickness of the dummy electrode 11 which makes contact with the AlGaN layer (barrier layer 4).

According to such a structure, by depositing the dielectric film 8 having a film thickness thinner than that of the dummy electrode 11, the side surfaces of the dummy electrode 13 can be partially exposed, which makes it easy to remove the dummy electrode 13 in a subsequent step.

In such a process, the dielectric film 8 may be thinner than the metal layer. However, it is further preferable that a thickness of the dielectric film 8 be equal to or smaller than a half of a height of the dummy electrode 13, because the side surfaces of the dummy electrode 13 can be reliably exposed.

While the invention has been shown and described in detail, the foregoing description is in all aspects illustrative and not restrictive. It is therefore understood that numerous modifications and variations can be devised without departing from the scope of the invention.

What is claimed is:

1. A method for manufacturing a heterojunction semiconductor device comprising an AlGaN layer, the method comprising:
    (a) forming a dummy electrode comprising a metal, in a region where a gate electrode will be arranged on the AlGaN layer;
    (b) anisotropically depositing a dielectric film on the AlGaN layer, leaving one or more side surfaces of the dummy electrode exposed;
    (c) forming an opening in the dielectric film by removing the dummy electrode; and
    (d) forming the gate electrode that extends from inside the opening onto the dielectric film in a vicinity of the opening.

2. The method according to claim 1,
    wherein the removing of the dummy electrode in (c) is performed by a wet etching process.

3. The method according to claim 1,
    wherein the removing of the dummy electrode in (c) is performed by an ultrasonic cleaning process.

4. The method according to claim 1,
    wherein the dummy electrode has an adherence with the AlGaN layer that is lower than an adherence of the dielectric film with the AlGaN layer in the region where the gate electrode will be arranged on the AlGaN layer.

5. The method according to claim 1,
    wherein the dielectric film has a removal rate less than a removal rate of the dummy electrode.

6. The method according to claim 1,
    wherein the anisotropic depositing of the dielectric film in (b) is performed by a Cat-CVD method.

7. The method according to claim 1,
    wherein the anisotropic depositing of the dielectric film in (b) is performed by an ECR sputtering method.

8. The method according to claim 1,
    wherein the anisotropic depositing of the dielectric film in (b) is performed so that the dielectric film is thinner than a thickness of the dummy electrode that makes contact with the AlGaN layer.

9. The method according to claim 1,
    wherein the dummy electrode formed in (a) has a T-shape.

10. The method according to claim 9,
    wherein the forming of the dummy electrode in (a) comprises forming two or more layers of dummy materials, and
    a dummy material layer making contact with the AlGaN layer is more soluble than other dummy layers in an acid or an alkaline solution.

11. The method according to claim 1,
wherein the metal in the dummy electrode is at least one metal selected from the group consisting of Nb, Ta, Ti and Zr.

12. The method according to claim 1,
wherein the metal in the dummy electrode is at least one metal selected from the group consisting of Al, Cr, Fe and Ni.

13. The method according to claim 1,
wherein the metal in the dummy electrode is at least one metal selected from the group consisting of Ag, Hg, Se and Zn.

14. The method according to claim 1,
wherein the metal in the dummy electrode is at least one metal selected from the group consisting of Be, As, Mo, Nb, Re and Sb.

15. The method according to claim 1,
wherein the metal in the dummy electrode is at least one metal selected from the group consisting of Au, Mo, Pd, Pt and W.

16. The method according to claim 1,
wherein the dielectric film comprises at least one compound selected from the group consisting of $SiN_x$, $SiO_x$, $SiO_xN_y$, $Al_xN_y$, $AlO_xN_y$, $SiN_y$ and $HfO_xN_y$.

* * * * *